United States Patent
Kobayashi et al.

(10) Patent No.: US 7,916,447 B2
(45) Date of Patent: Mar. 29, 2011

(54) ELECTROSTATIC CHUCK FOR SUBSTRATE STAGE, ELECTRODE USED FOR THE CHUCK, AND TREATING SYSTEM HAVING THE CHUCK AND ELECTRODE

(75) Inventors: Toshiki Kobayashi, Kanagawa (JP); Katsuhiko Iwabuchi, Kanagawa (JP)

(73) Assignee: Future Vision Inc., Tokyo (JP)

( * ) Notice: Subject to any disclaimer, the term of this patent is extended or adjusted under 35 U.S.C. 154(b) by 0 days.

(21) Appl. No.: 10/563,302

(22) PCT Filed: Jun. 25, 2004

(86) PCT No.: PCT/JP2004/009346
§ 371 (c)(1),
(2), (4) Date: Jan. 4, 2006

(87) PCT Pub. No.: WO2005/004229
PCT Pub. Date: Jan. 13, 2005

(65) Prior Publication Data
US 2006/0164786 A1    Jul. 27, 2006

(30) Foreign Application Priority Data
Jul. 8, 2003  (JP) ................................. 2003-193479

(51) Int. Cl.
*H01L 21/683* (2006.01)
(52) U.S. Cl. ........................................ 361/234; 198/619
(58) Field of Classification Search ................... 361/234; 198/619
See application file for complete search history.

(56) References Cited

U.S. PATENT DOCUMENTS

| | | | | |
|---|---|---|---|---|
| 4,848,536 A | * | 7/1989 | Machida | 198/619 |
| 5,315,473 A | * | 5/1994 | Collins et al. | 361/234 |
| 5,978,202 A | * | 11/1999 | Wadensweiler et al. | 361/234 |
| 6,490,145 B1 | * | 12/2002 | Kholodenko et al. | 361/234 |
| 6,608,745 B2 | * | 8/2003 | Tsuruta et al. | 361/234 |
| 6,781,669 B2 | * | 8/2004 | Tanaka | 355/53 |
| 2003/0044653 A1 | * | 3/2003 | Hiramatsu et al. | 428/704 |

FOREIGN PATENT DOCUMENTS

JP   62211363   *  9/1987

OTHER PUBLICATIONS

Merriam-Webster's Collegiate Dictionary, 1999, Merriam-Webster, 10th, 278.*

* cited by examiner

*Primary Examiner* — Stephen W Jackson
*Assistant Examiner* — Tien Mai
(74) *Attorney, Agent, or Firm* — Antonelli, Terry, Stout & Kraus, LLP.

(57) ABSTRACT

An electrostatic chuck is provided for a substrate stage that can be used in plasma treatment of various substrates such as a large-sized glass substrate for a flat panel display (FPD), a semiconductor wafer or the like. The electrostatic chuck is divided into a plurality of electrodes formed into nearly bar-like shapes. In accordance with an exemplary embodiment, each of the divided bar-like electrodes includes an inner electrode and a single layer thermally sprayed film formed on the surface of the inner electrode, with the bar-like electrodes disposed in parallel so as to form a plane electrode.

13 Claims, 7 Drawing Sheets

A  B

POSITIVE OR NEGATIVE

ELECTROSTATIC CHUCK FOR SUBSTRATE STAGE, ELECTRODE USED FOR THE CHUCK, AND TREATING SYSTEM HAVING THE CHUCK AND ELECTRODE

TECHNICAL FIELD

The present invention relates to an electrostatic chuck for a substrate stage used in plasma treatment of various substrates such as a large-sized glass substrate for a flat panel display (FPD), a semiconductor wafer or the like, an electrode used for the chuck, and a treating system having the chuck and the electrode.

BACKGROUND ART

A substrate stage is used in a plasma treatment apparatus for various substrates (hereinafter also referred to generically as substrate simply) such as a glass substrate for FPD, a semiconductor wafer, etc. In the background art, for example, an electrostatic chuck for attracting a wafer by use of an electric Coulomb force is used as the substrate stage. In addition, as for the structure of the electrostatic chuck, a mono-pole type and a bi-pole type are used. In the mono-pole type, a potential difference is provided between an electrode inside the electrostatic chuck and a substrate so as to attract the substrate. In the bi-pole type, an electrode is divided into two or more pieces inside the electrostatic chuck, and a positive or negative potential to the ground is applied to each piece so as to attract a substrate.

Particularly in some kind of electrostatic chuck for a glass substrate, a pair of semicircular, ring-like or concentric plane electrodes are used and an electric potential difference is applied between the plane electrodes so as to electrostatically attract the substrate. This electrostatic chuck is constituted by an inner electrode, an insulating film and a ring-like outer electrode outside the inner electrode, and further an insulating film (dielectric film) for electrostatic attraction.

Inside the inner electrode, a coolant channel is formed while a ring-like concave portion is, for example, formed to form the outer electrode in the upper surface.

In addition, the inner electrode is produced out of a conductive material such as an aluminum alloy or the like, and an insulating material coating this conductive material and a ring electrode. That is, the outer electrode formed out of a conductive material such as tungsten or the like is provided like a ring on the concave portion of the upper surface of the inner electrode through an insulating film formed out of a multi-layer thermally sprayed film (alumina in this case). This insulating film is located between the inner electrode and the ring-like outer electrode so as to secure electrostatic insulation between the two electrodes. Further, an insulating film composed of a thermally sprayed film (alumina in this case) may be formed on the surfaces of the inner electrode and the ring-like outer electrode (e.g. see JP-A-10-150100, pp. 5-6, paragraph [0021], and FIGS. 1 and 2), or a so-called comb-like electrode is used as an electrode shape (e.g. see JP-A-11-354504, pp. 9-10, paragraph [0049], and FIG. 1(c)).

DISCLOSURE OF THE INVENTION

Problems that the Invention is to Solve

However, in such an electrostatic chuck for a substrate stage used in a background-art plasma treatment apparatus and such an electrode used for the chuck, an integrated plane electrode in a ring-like, semicircular or concentric shape covered with multi-layer thermally sprayed film is used. Accordingly, when a part of the electrode is damaged, the electrode as a whole has to be replaced and repaired. In addition, since the thermally sprayed film applied to the electrode is multi-layered, the reliability is extremely low when a substrate to be treated becomes large in size and is used in high-temperature conditions. Further, the electrode has an integrated structure (single electrode) or is simply divided into two or three. Accordingly, dedicated equipment is required to increase the scale of a plant for production. Accordingly, there has been a tendency that the manufacturing cost of the electrode is increased, and the delivery of the electrode as a product is delayed.

In order to solve the aforementioned problems belonging to the electrostatic chuck for a substrate stage used in the background-art plasma treatment apparatus, it is therefore an object of the present invention to provide an electrostatic chuck and an electrode for a substrate both high in reliability and easy to produce, and a treating system having the chuck and the electrode.

Means for Solving the Problems

The present invention is characterized in that an electrode for use in an electrostatic chuck is divided into a plurality of electrodes formed into nearly bar-like shapes, and each of the divided bar-like electrodes is constituted by an inner electrode and a single layer thermally sprayed film formed on the surface of the inner electrode, while these bar-like electrodes are disposed in parallel so as to form a plane electrode.

BRIEF DESCRIPTION OF THE DRAWINGS

FIG. 8 are graphs each showing a temporal change of a residual attraction force of the electrodes of the electrostatic chuck for a substrate stage, FIG. 8(a) showing a case where the power supply pins are released after the power supply is turned off, FIG. 8(b) showing a case where the power supply pins are released with the power supply being left on.

BEST MODE FOR CARRYING OUT THE INVENTION

Figure 1:
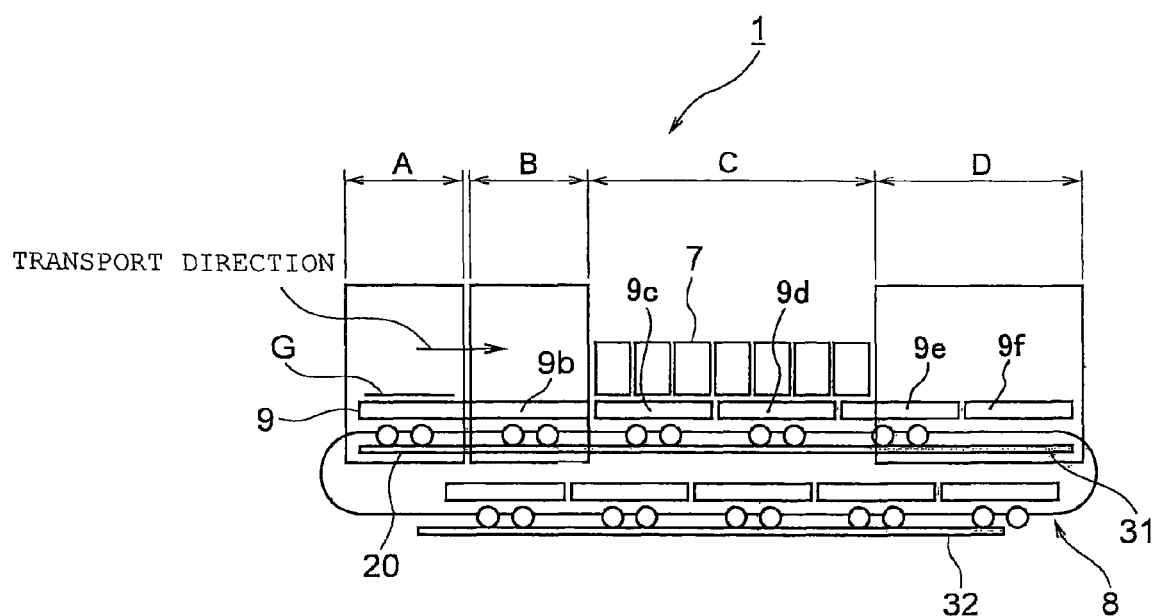
FIG. 1 is a conceptual configuration view showing a function in each treatment position of a plasma treatment apparatus in which an electrostatic chuck for a substrate stage according to the present invention is used.

Embodiments of an electrostatic chuck for a substrate stage, an electrode used for the chuck, and a treating system having the chuck and the electrode according to the present invention will be described below in detail with reference to the accompanying drawings.

Plasma Treatment Apparatus

A plasma treatment apparatus 1 in which an electrostatic chuck for a substrate stage according to the present invention is used is designed to perform continuous conveyance treatments, that is, in-line treatments upon a substrate G (e.g. glass substrate). Various in-line treatments are performed while a substrate stage 9 mounted with the substrate G is conveyed to positions 9b, 9c, 9d, 9e and 9f in zones A to D successively in that order in a transfer direction by an endless substrate conveyance mechanism 8 having a return loop. The zone A is a substrate transfer/preheating/attraction zone provided with a heating unit 20. The zone B is a heating zone. The zone C is a film-forming or etching zone having a plasma unit 7. The zone D is a cooling/release-transfer zone having a cooling unit 31.

In a return path, the substrate stage 9 returns to the initial transfer zone A while being cooled or heated by another cooling unit 32 or another heating unit provided in a bottom portion of the plasma treatment apparatus 1. In the transfer zone A, the substrate G is transferred by a conventional transfer mechanism from a pre-step (e.g. wet cleaning step) to the substrate stage 9, preheated and attracted to the electrostatic chuck supplied with electric power.

Further, in the film-forming (or etching) zone C, narrow-line shaped plasma is formed using electromagnetic waves by the plasma unit 7 (narrow-line shaped plasma unit having seven plasma heads by way of example), so as to perform a CVD film-forming (or etching) treatment upon the surface of the substrate G at a process temperature of about 250-300° C. while the surface of the substrate G is kept horizontal with respect to the narrow-line shaped plasma and the relative position of the substrate G to the plasma is continuously moved. In this event, about ±5° C. is allowed in the temperature distribution on the substrate G. Then, the substrate G subjected to the plasma treatment is cooled in the cooling/transfer zone D, released from the electrostatic chuck and transferred to the next step by a conventional transfer mechanism such as a transfer robot or the like. Incidentally, carrying-out of the substrate subjected to the plasma treatment may be performed on the carrying-in side.

Due to such an apparatus configuration, plasma treatment can be performed, for example, fast enough to treat 60 glass substrates measuring 1,100 mm by 1,300 mm per hour.

Electrostatic Chuck for Substrate Stage

Figure 2:
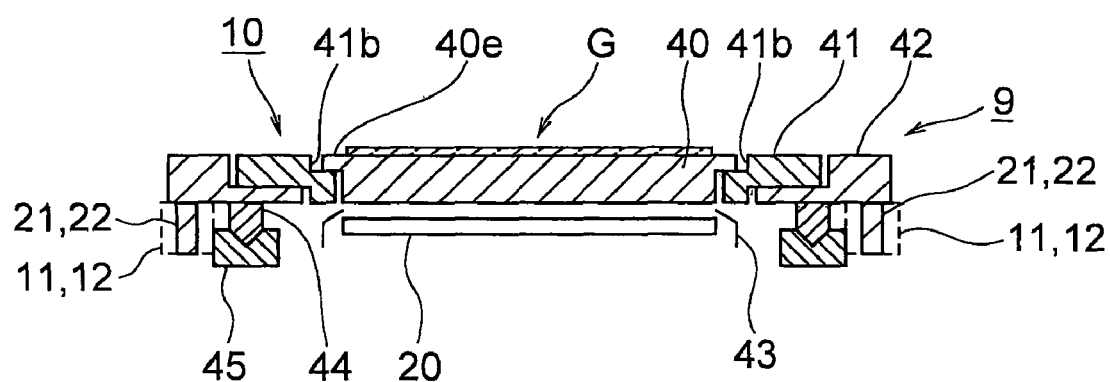
FIG. 2 are explanatory views of a main portion structure and a substrate release operation of the electrostatic chuck for a substrate stage according to the present invention, FIG. 2(a) being a longitudinally sectional view showing a state where a substrate has been mounted on the electrostatic chuck for a substrate stage, FIG. 2(b) being a longitudinally sectional view showing a state where lift pins have been moved up for the purpose of releasing the substrate mounted on the electrostatic chuck for a substrate stage so that the substrate is released from an attraction surface of the electrostatic chuck, and mounted on a transfer fork.
Figure 2:
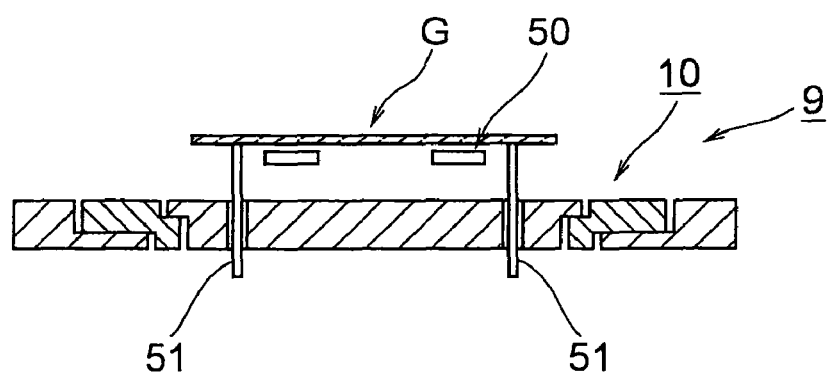

An electrostatic chuck 10 for a substrate stage for attracting and retaining the substrate G according to the present invention has a frame 41 with stepped portions 41b on the inner sides. A front wheel roller 21 and a rear wheel roller 22 are attached to a lower portion of the frame 41. As shown in FIG. 2(a), front wheels and rear wheels are engaged with a front wheel guide rail 11 and a rear wheel guide rail 12 provided in the frame of the treatment apparatus. In addition, guide pieces 44 suspended from the substrate stage 9 are guided by guide piece bearers (V-grooved rails) 45 fixedly provided on the frame of the treatment apparatus. Thus, the electrostatic chuck 10 is transported. For example, the substrate G to be attracted by this electrostatic chuck 10 is a large-sized glass substrate for FPD. For example, the glass substrate measures 1,100 mm by 1,300 mm and has a thickness of about 0.63-0.70 mm. Therefore, the electrostatic chuck 10 has to have a large-sized substrate attraction surface fit to this size (for example, measuring 1,120 mm by 1,300 mm).

To this end, in the electrostatic chuck 10 according to the present invention, differently from the background-art electrostatic chuck, an electrode to be used is divided into a plurality of bar-like electrodes 40 (for example, divided into ten) each composed of a square material about 1,120 mm long and about 40 mm wide, or a bar-like piece having a sectional shape which will be described later.

Then, in the electrodes 40 of the electrostatic chuck 10 according to the present invention, as shown in FIG. 3, powder of highly pure ceramics (e.g. $Al_2O_3$) is melted and sprayed to be about 300-400 μm thick on the whole surfaces (including the front, rear and end faces) of base materials 40a (e.g. metal-ceramics composite materials or highly pure isotropic graphite materials) having high thermal conductivity and low thermal expansivity, by a vacuum spray deposit method. The ceramics thermally sprayed as a single layer is solidified to form a thermally sprayed film (insulating film) 40b for electrostatic attraction. Due to this insulating film, an electric circuit for electrostatic attraction can be formed, and occurrence of damage or the like caused by film-forming gas, etching gas, cleaning gas such as $NF_3$ or the like can be avoided.

Figure 3A:
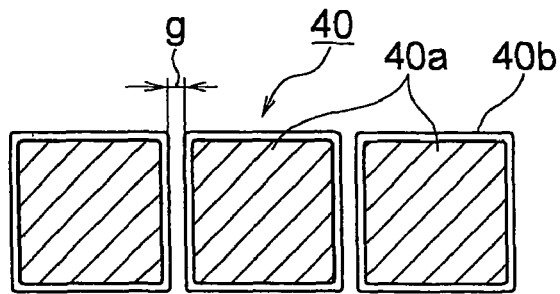
FIG. 3 are sectional views of electrodes for use in the electrostatic chuck for a substrate stage according to the present invention, FIG. 3(a) showing square electrodes, FIG. 3(b) showing rectangular electrodes, FIG. 3(c) showing electrodes formed into stepped shapes, FIG. 3(d) showing electrodes like roofing tiles, FIG. 3(e) showing electrodes different in width.
Figure 3B:
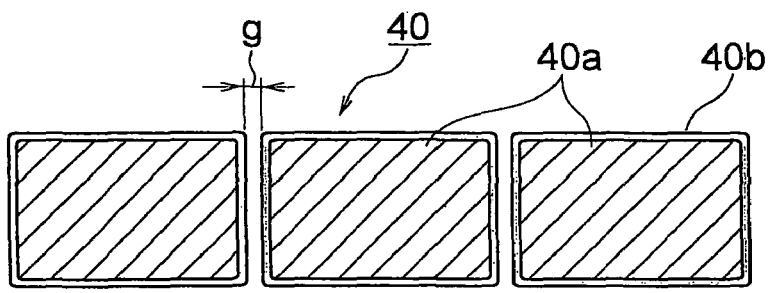
Figure 3C:
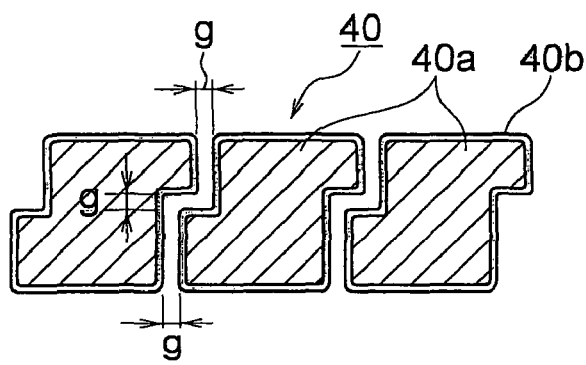
Figure 3D:
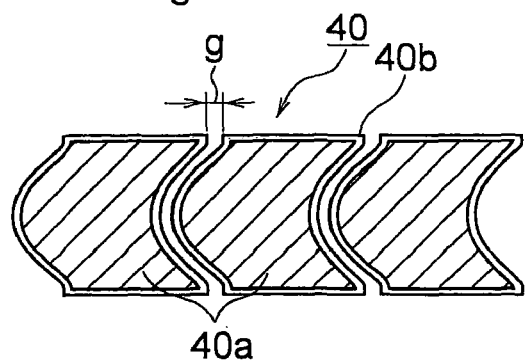
Figure 3E:
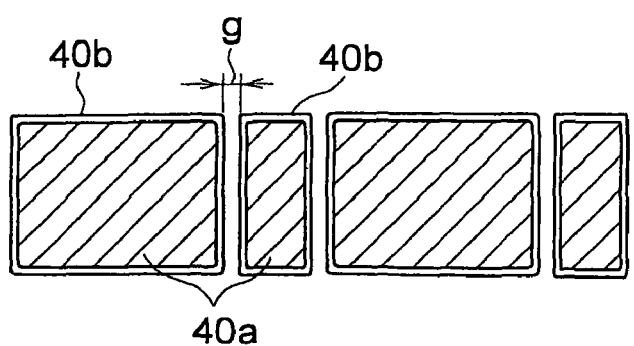

Here, as for the shapes of the base materials forming the electrodes 40, the sectional shapes of the base materials 40a may be formed into squares as shown in FIG. 3(a), or the sectional shapes may be formed into wide rectangles as shown in FIG. 3(b), or the sectional shapes may be formed into stepped shape as shown in FIG. 3(c). In any one of the aforementioned shapes highly pure ceramics may be thermally sprayed to form a single layer thermally sprayed film 40b on the surfaces of the base materials 40a is formed In the stepped shapes aforementioned the heat radiation from the heating heater is blocked by the stepped shapes so that the uniformity of the temperature distribution in the substrate G is improved. Alternatively, suitable surfaces of the base materials of the electrodes 40 may be hollowed to lighten the electrodes 40. Further, as shown in FIG. 3(d), the sectional shapes of the base materials 40 may be formed like roofing tiles each of which has a curved convex portion on one side and a curved concave portion on the other side. In this case, the electrodes are disposed to secure a predetermined clearance q between the convex portion of one electrode and the concave portion of another adjacent electrode. Alternatively, as shown in FIG. 3(e), the electrodes 40 may be formed out of base materials 40a different in width.

Figure 4:
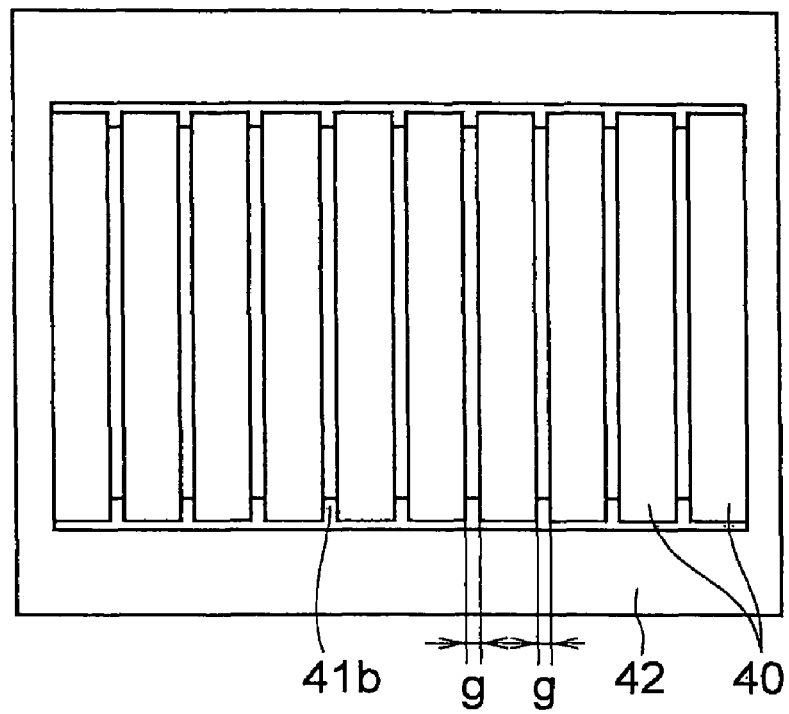
FIG. 4 is a plan view showing an embodiment of the electrostatic chuck for a substrate stage according to the present invention shown in FIG. 2, and showing a state where electrodes to be used in the electrostatic chuck are arranged in parallel like strips on a frame.

Then, for example, an electrode support frame 41 like a picture frame is fixedly attached to a stage frame 42 (made of a low thermal expansion metal material such as SUS430, 42 alloy) of the substrate stage 9. The bar-like (sectionally square, rectangular, stepped or roofing-tile-like) electrodes 40 in which a thermally sprayed film 40b of highly pure ceramics is formed on the surface of each base material 40a arranged in the aforementioned manner are disposed so that the electrodes 40 with stepped portions 40e (see FIG. 2(a)) in their opposite ends bridge between the opposite stepped portions 41b of the support frame 41 as shown in FIG. 4. For example, ten electrodes 40 are mounted in parallel so as to secure a clearance q (e.g. about 2 mm) between the electrodes 40 and 40. The clearance q is an empty space. In this event, the stepped portions 40e of the electrodes 40 are fixed onto the stepped portions 41b of the support frame 41 by clamps (not shown) having a flexibility in the longitudinal direction. Here, a heat shield plate 43 is disposed between the heating unit 20 (e.g. far infrared heater) fixed under the electrodes 40 and the support frame 41 so as to block heat radiation from the heating unit 20 to any other member than the electrodes 40.

After that, in the transfer zone A, the substrate G is attracted to the electrode 40 surfaces as soon as power is supplied to the electrostatic chuck 40 by a power supply device (not shown). When the substrate G is to be released, static electricity is eliminated from the electrodes 40 by a conventional means, and then, for example, four lift pins 51 penetrating the substrate stage 9 so as to extend out thereon are moved up by an elevating mechanism (not shown) so as to release the substrate G from the electrodes 40, as shown in FIG. 2(b).

Here, although the electrodes 40 are mounted in parallel on the electrode support frame 41, a plurality of electrodes 40 may be disposed thereon with an upper surface of the substrate stage 9 to be formed flat, for example, along the edge portion of the substrate G or like bricks in desired places with a clearance (gap) q between adjacent ones of the electrodes 40. In any one of these ways to dispose the electrodes 40, the substrate G (e.g. glass substrate) is attracted onto the upper surfaces of the electrodes 40 perfectly.

In any one of the aforementioned dispositions of the electrodes 40, adjacent electrodes 40 and 40 are separated by the clearance (gap or space) q. Accordingly, insulation between the electrodes 40 and 40 is secured perfectly so that abnormal discharge (lateral discharge) between adjacent electrodes is prevented. Thus, electric charges are not extinguished, so that the attraction state is kept.

Next, description will be made on the method for supplying power to the electrostatic chuck 10 for a substrate stage according to the present invention.

Figure 5:
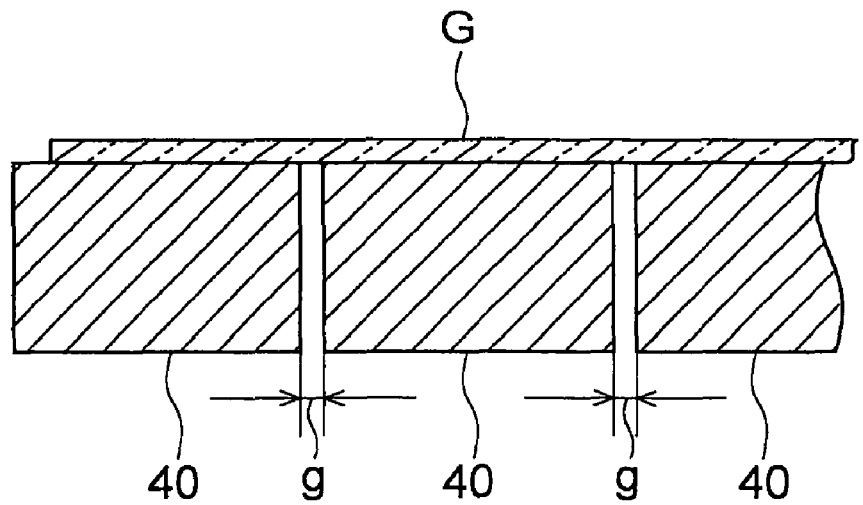
FIG. 5 is a conceptual view showing a state where a substrate has been attracted by the electrostatic chuck for a substrate stage according to the present invention.
Figure 6A:
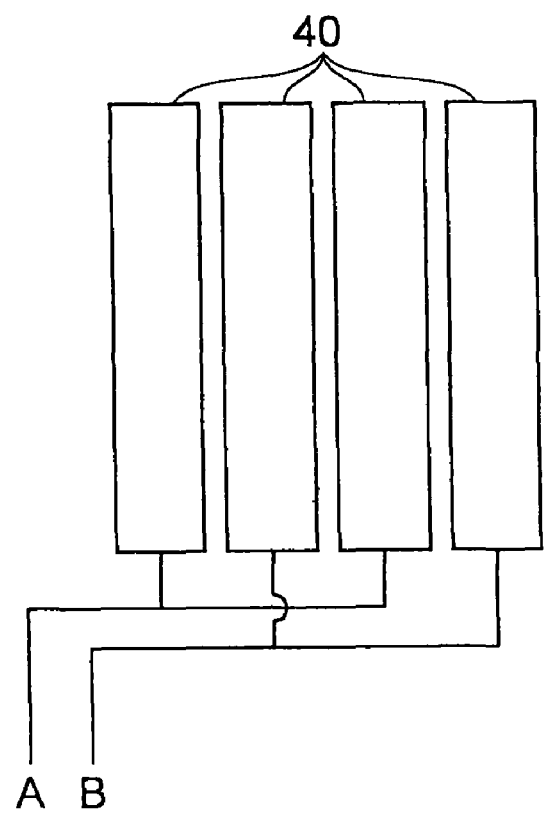
FIG. 6 are conceptual diagrams showing methods for wiring to the electrodes of the electrostatic chuck for a substrate stage according to the present invention, FIG. 6(a) showing wiring with different polarity A and B, FIG. 6(b) showing wiring changeable the polarity over to positive r negative.
Figure 6B:
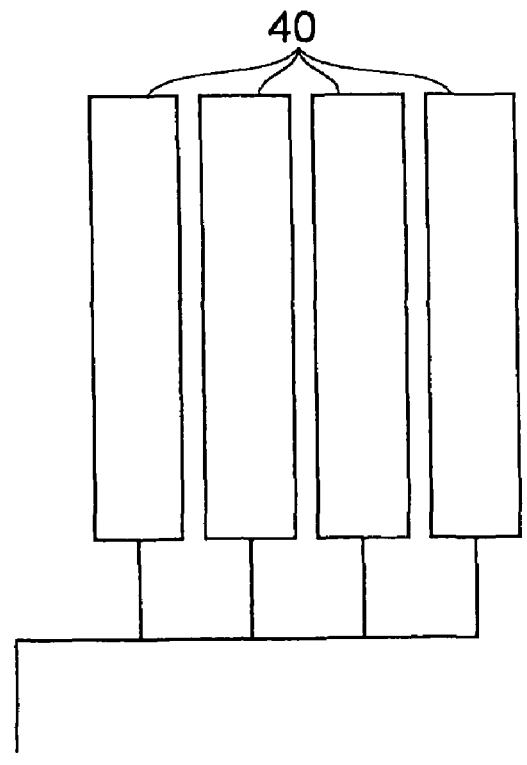

First, for example, as shown in FIG. 5, a plurality of electrodes 40 are disposed to form a gap q between adjacent electrodes 40 and 40, and the substrate G is disposed thereon. Then, as shown in FIG. 6, the electrodes 40 and 40 are wired individually (as shown in FIG. 6(a) or as shown in FIG. 6(b)). Then, in the wiring of FIG. 6(a), as shown in Table 1, a positive (+) or negative (−) potential to the ground is applied to change over a mono-pole or a bi-pole connected to each terminal.

In the example of wiring in FIG. 6(b), a positive or negative potential to the ground is applied. Thus, the electrodes form mono-polar.

Here, the principles of attraction of the glass substrate G in the electrostatic chuck for a substrate stage according to the present invention will be described.

Figure 7A:
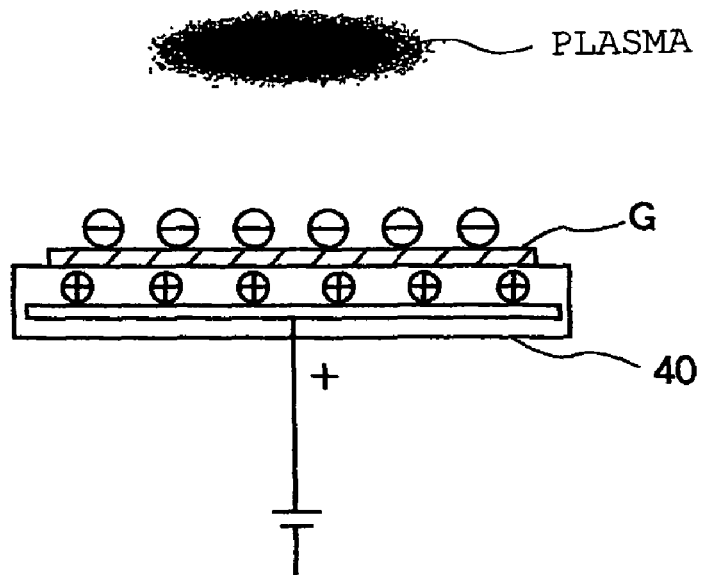
FIG. 7 are schematic views showing principles that a substrate can be attracted by the electrostatic chuck for a substrate stage, FIG. 7(a) showing a state where a substrate has been attracted on an electrode surface due to a Coulomb force under the presence of plasma by use of a conventional monopole electrode according to a background-art technique, FIG. 7(b) showing a state where a substrate has been attracted on an electrode surface by use of a bi-pole electrode but without the presence of plasma in the electrostatic chuck for a substrate stage according to the present invention, FIG. 7(c) showing a state where a substrate stage according to the present invention has been attracted under the presence of plasma by use of a mono-pole electrode.

As shown in FIG. 7(a), according to the background-art method, when a current is applied to an electrode 40 using a normal mono-pole under the presence of plasma, the surface of the glass substrate G is charged with negative electrons from the plasma. Thus, a Coulomb force is generated to attract the glass substrate G onto the electrode 40 surface.

Figure 7B:
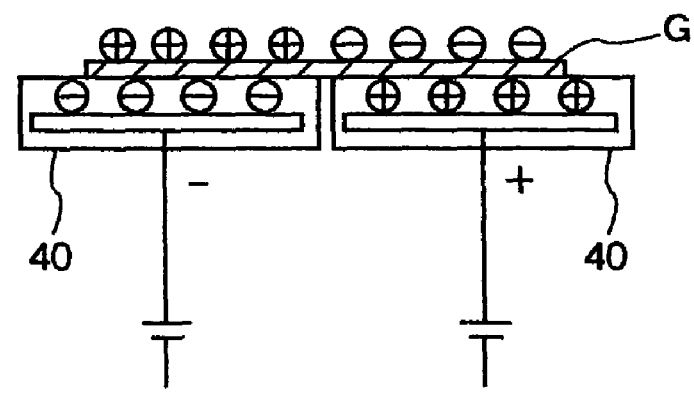
Figure 7C:
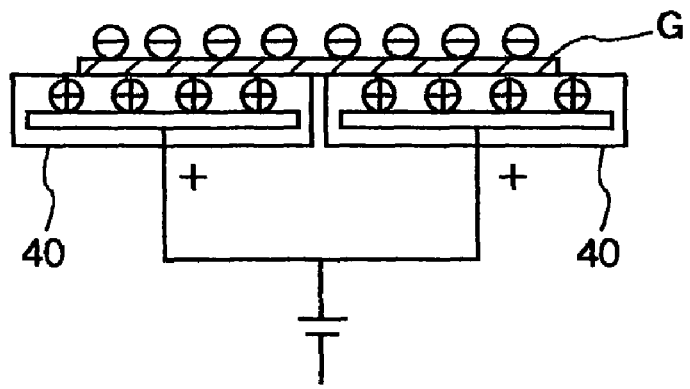

FIG. 7(c) according to the present invention, shows an example of a mono-pole type in which attraction is attained through plasma in the same manner as in the background-art method. Further, FIG. 7(b) shows an example of a bi-pole type in which attraction is attained without intermediary of plasma.

The glass substrate G is generally of a high resistant material at a room temperature. However, when a high voltage is applied for a moment, the glass substrate is polarized near the surface thereof so that an attraction force is generated. In addition, when resistance of the glass substrate is reduced in high temperature so that the glass substrate exhibits conductivity so as to be polarized, an attraction force is generated.

Figure 8A:
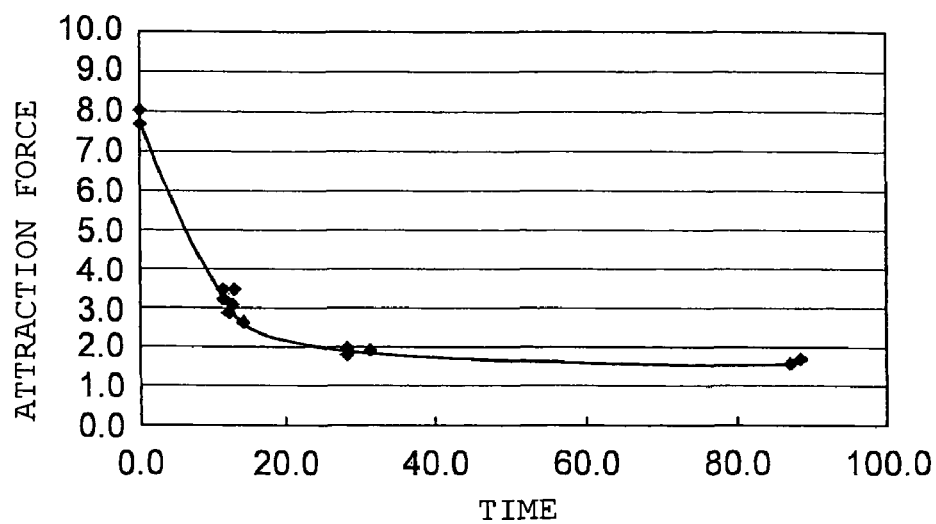
Figure 8B:
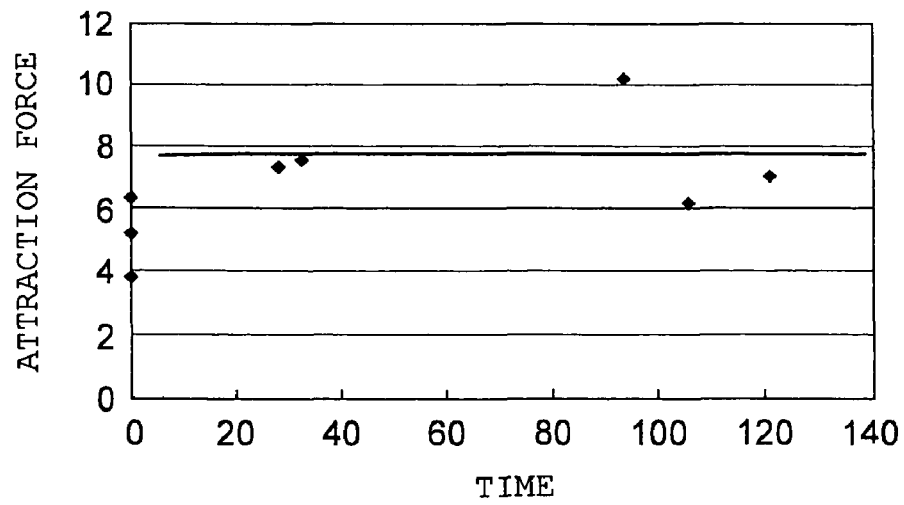

Particularly in the electrostatic chuck for a substrate stage for use in the plasma treatment apparatus according to the present invention, power is supplied to the electrodes 40 by a power supply means on the substrate stage 9 in the zone A shown in FIG. 1 The power supply pins (not shown) are detached from the electrodes 40 with the power being left on, just before the substrate G is transported to 9b, 9c and 9d. Accordingly, as shown in FIG. 8(b), insulation secured between adjacent electrodes 40 and 40 prevents charges from escaping, as compared with the case where the electrodes are turned off with the power supply pins in connection thereto (see FIG. 8(a)). Thus, the residual attraction force can be kept for a considerable time, so that the substrate can be retained in the attraction state. As a result, plasma treatment can be performed on the substrate G attracted onto the electrostatic chuck perfectly, till the substrate G is thrust up by the lift pins 51 and released by a robot arm 50 or the like in the cooling/release/transfer zone D after the plasma treatment. Particularly, here, the residual attraction force can be increased by increasing the applied voltage and increasing the number of divided electrodes.

EFFECT OF THE INVENTION

In an electrostatic chuck for a substrate stage, an electrode used for the chuck, and a treating system having the chuck and the electrode according to the present invention, highly pure ceramic is thermally sprayed to form a single layer on electrode materials of bar-like inner electrodes divided into a plurality of pieces, so as to form electrodes for the electrostatic chuck. Accordingly, high reliability can be obtained. In addition, when a plurality of these electrodes are disposed in parallel, the electrodes can be disposed desirably in the width direction thereof. Further, since the electrodes are divided into several electrodes, a part of the electrodes can be replaced and repaired when the electrodes are damaged. Thus, it is possible to deal with large-scaled substrates. Since each individual electrode does not have a large area, it is easy to convey and handle the electrode. In addition, the types of electrostatic chuck can be changed over to bi-pole type or mono-pole type in accordance with the way of wiring to the electrodes. Further, the electrodes can be manufactured at a lower price and in a shorter time than in the background art.

The invention claimed is:

1. An electrostatic chuck for electrostatically attracting a substrate which is rectangular when viewed in a planar view, and which has a longer side and a shorter side, said electrostatic chuck comprising a plurality of rod-like electrodes having shorter sides and longer sides, wherein shorter sides of each of said rod-like electrodes are oriented toward outside the electrostatic chuck, and longer sides of each of the rod-like electrodes are parallel to longer sides of adjacent rod-like electrodes, said electrostatic chuck further comprising means for mounting the rectangular substrate on the electrostatic chuck, so that, when the rectangular substrate is mounted on the substrate mounting surface, the rod-like electrodes are disposed along an edge portion of the rectangular substrate to be treated so that one of said shorter sides of each of said rod-like electrodes extends in parallel to a longer side of said rectangular substrate, wherein said rod-like electrodes are comprised of rod-like base materials, wherein cross-sections with respect to a vertical cut-through of said rod-like base materials are in stepped shapes, and wherein said rod-like electrodes are arranged with a predetermined gap (clearance) between adjacent rod-like electrodes, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate.

2. An electrostatic chuck according to claim 1, wherein said means for mounting said rectangular substrate on the electrostatic chuck comprises configuring the rod-like electrodes and locating them so that said rectangular substrate and said electrostatic chuck are movable together, with the substrate fixed immovably to the electrostatic chuck, through a plurality of treatment stations.

3. An electrostatic chuck for electrostatically attracting a rectangular substrate which is rectangular when viewed in a planar view, and which has a longer side and a shorter side, including a rectangular substrate mounting surface for receiving the rectangular substrate, said electrostatic chuck comprising a plurality of rod-like electrodes having shorter sides and longer sides, wherein shorter sides of each of said rod-like electrodes are oriented toward outside the electrostatic chuck, and longer sides of each of the rod-like electrodes are parallel to longer sides of adjacent rod-like electrodes, said electrostatic chuck further comprising means for mounting the rectangular substrate on the electrostatic chuck so that, when the rectangular substrate is mounted on the substrate mounting surface, the rod-like electrodes are disposed along an edge portion of the rectangular substrate to be treated so that one of the shorter sides of each of said rod-like electrodes extends in parallel to a longer side of said rectangular substrate, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate, wherein said rod-like electrodes are comprised of rod-like base materials, and cross-sections with respect to a vertical cut-through of said rod-like base materials are arranged like roofing tiles, each having a curved convex portion on one side and a curved concave portion on the other side, and wherein each of said convex portions is arranged with a predetermined gap (clearance) between said convex portion and said concave portion of an adjacent rod-like electrode.

4. An electrostatic chuck according to claim 3, wherein said means for mounting said rectangular substrate on the electrostatic chuck comprises configuring the rod-like electrodes and locating them so that said rectangular substrate and said electrostatic chuck are movable together, with the substrate fixed immovably to the electrostatic chuck, through a plurality of treatment stations.

5. An electrode structure for an electrostatic chuck for electrostatically attracting a substrate which is rectangular when viewed in a planar view, and which has a longer side and a shorter side, said electrode structure being comprised of a plurality of rod-like electrodes having shorter sides and longer sides wherein shorter sides of each of said rod-like electrodes are oriented toward outside the electrostatic chuck, and longer sides of each of the rod-like electrodes are parallel to longer sides of adjacent rod-like electrodes, said electrostatic chuck further comprising means for mounting the rectangular substrate on the electrostatic chuck so that when the rectangular substrate is mounted on the substrate mounting surface, the rod-like electrodes are disposed so that one of the shorter sides of each of said rod-like electrodes extends in parallel to a longer side of said rectangular substrate, and wherein each of the rod-like electrodes includes high-purity ceramic that is thermally sprayed on a surface of rod-like base materials, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate, wherein cross-sections with respect to a vertical cut-through said base materials are in stepped shapes.

6. An electrode structure according to claim 5, wherein said base materials are comprised of high-purity isotropic graphite.

7. An electrode structure according to claim 5, wherein said means for mounting said rectangular substrate on the electrostatic chuck comprises configuring the rod-like electrodes and locating them so that said rectangular substrate and said electrostatic chuck are movable together, with the substrate fixed immovably to the electrostatic chuck, through a plurality of treatment stations.

8. An electrode structure for an electrostatic chuck for electrostatically attracting a substrate which is rectangular when viewed in a planar view, and which has a longer side and a shorter side, said electrode structure being comprised of a plurality of rod-like electrodes having shorter sides and longer sides wherein shorter sides of each of said rod-like electrodes are oriented toward outside the electrostatic chuck, and longer sides of each of the rod-like electrodes are parallel to longer sides of adjacent rod-like electrodes, said electrostatic chuck further comprising means for mounting the rectangular substrate on the electrostatic chuck so that when the rectangular substrate is mounted on the substrate mounting surface, the rod-like electrodes are disposed so that one of the shorter sides of each of said rod-like electrodes extends in parallel to a longer side of said rectangular substrate, and wherein each of the rod-like electrodes includes high-purity ceramic that is thermally sprayed on a surface of rod-like base materials, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate, wherein cross-sections with respect to a vertical cut-through of said base materials are arranged like roofing tiles having a curved convex portion on one side and a curved concave portion on the other side.

9. An electrode structure according to claim 8, wherein said means for mounting said rectangular substrate on the electrostatic chuck comprises configuring the rod-like electrodes and locating them so that said rectangular substrate and said electrostatic chuck are movable together, with the substrate fixed immovably to the electrostatic chuck, through a plurality of treatment stations.

10. A treating system provided with a rectangular substrate stage for electrostatically attracting a substrate which is rectangular when viewed in a planar view, and which has a longer side and a shorter side, wherein said rectangular substrate stage comprises a plurality of rod-like electrodes each having shorter sides and longer sides, wherein shorter sides of each of said rod-like electrodes are oriented toward outside the rectangular substrate stage; the longer sides of each of the rod-like electrodes are parallel to the longer sides of adjacent rod-like electrodes; and a rectangular substrate is subjected to be electrostatically attracted by the plurality of rod-like electrodes; said rectangular substrate stage further comprising means for mounting the rectangular substrate on the rectangular substrate stage so that, when the rectangular substrate is mounted on the rectangular substrate stage, the rod-like electrodes will be disposed along an edge portion of said rectangular substrate to be treated so that one of the shorter sides of each of said rod-like electrode extends in parallel to a longer side of said rectangular substrate, wherein said rod-like electrodes are comprised of rod-like base materials, wherein cross-sections with respect to a vertical cut-through of said rod-like base materials are in stepped shapes, and wherein said rod-like electrodes are arranged with a predetermined gap (clearance) between adjacent rod-like electrodes, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate.

11. A treating system according to claim 10, wherein said means for mounting said rectangular substrate on the electrostatic chuck comprises configuring the rod-like electrodes and locating them so that said rectangular substrate and said electrostatic chuck are movable together, with the substrate fixed immovably to the electrostatic chuck, through a plurality of treatment stations.

12. A treating system provided with a rectangular substrate stage for electrostatically attracting a substrate which is rectangular when viewed in a planar view, and which has a longer side and a shorter side, wherein said rectangular substrate stage comprises a plurality of rod-like electrodes each having shorter sides and longer sides, wherein shorter sides of each of said rod-like electrodes are oriented toward outside the rectangular substrate stage; the longer sides of each of the rod-like electrodes are parallel to the longer sides of adjacent rod-like electrodes; and a rectangular substrate is subjected to be electrostatically attracted by the plurality of rod-like electrodes; said rectangular substrate stage further comprising means for mounting the rectangular substrate on the rectangular substrate stage so that, when the rectangular substrate is mounted on the rectangular substrate stage, the rod-like electrodes will be disposed along an edge portion of said rectangular substrate to be treated so that one of the shorter sides of each of said rod-like electrodes extends in parallel to a longer side of said rectangular substrate, wherein said rod-like electrodes are comprised of rod-like base materials, wherein cross-sections with respect to a vertical cut-through of said rod-like base materials are arranged like roofing tiles, each having a curved convex portion on one side and a curved concave portion on the other side, and wherein said convex portion is arranged with a predetermined gap (clearance) between said convex portion and said concave portion of an adjacent rod-like electrode, said means comprising configuring the rod-like electrode and locating them relative to one another to form a substrate mounting surface comprised of the rod-like electrodes, which substrate mounting surface has overall rectangular dimensions with a longer side equal to or greater in length than the length of the rectangular substrate and with a shorter side equal to or greater in length than the shorter side of the rectangular substrate.

13. A treating system according to claim 12, wherein said means for mounting said rectangular substrate on the electrostatic chuck comprises configuring the rod-like electrodes and locating them so that said rectangular substrate and said electrostatic chuck are movable together, with the substrate fixed immovable to the electrostatic chuck, through a plurality of treatment stations.

\* \* \* \* \*